(12) United States Patent
Lynch et al.

(10) Patent No.: US 10,892,746 B2
(45) Date of Patent: Jan. 12, 2021

(54) SWITCH ON-TIME CONTROLLER WITH DELAY LINE MODULATOR

(71) Applicant: TEXAS INSTRUMENTS INCORPORATED, Dallas, TX (US)

(72) Inventors: Brian Thomas Lynch, Brookline, NH (US); Stefan Wlodzimierz Wiktor, Raleigh, NC (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/544,061

(22) Filed: Aug. 19, 2019

(65) Prior Publication Data

US 2020/0228108 A1 Jul. 16, 2020

Related U.S. Application Data

(60) Provisional application No. 62/791,921, filed on Jan. 14, 2019.

(51) Int. Cl.
| | | |
|---|---|---|
| *H03K 7/08* | (2006.01) | |
| *H03K 3/017* | (2006.01) | |
| *H03M 1/12* | (2006.01) | |
| *H02M 3/156* | (2006.01) | |
| *H03K 3/353* | (2006.01) | |

(52) U.S. Cl.
CPC .............. *H03K 7/08* (2013.01); *H02M 3/156* (2013.01); *H03K 3/017* (2013.01); *H03K 3/353* (2013.01); *H03M 1/1215* (2013.01)

(58) Field of Classification Search
CPC combination set(s) only.
See application file for complete search history.

(56) References Cited

U.S. PATENT DOCUMENTS

| | | | |
|---|---|---|---|
| 7,061,292 B2* | 6/2006 | Maksimovic | G04F 10/005 327/161 |
| 9,306,548 B1 | 4/2016 | Wiktor et al. | |
| 9,893,621 B1* | 2/2018 | Newlin | H03K 7/08 |
| 9,991,777 B2 | 6/2018 | Lynch et al. | |
| 10,756,623 B1* | 8/2020 | Petersen | H02M 1/088 |
| 2002/0190283 A1* | 12/2002 | Seno | H03K 5/135 257/275 |
| 2004/0095115 A1* | 5/2004 | Kernahan | H02J 2207/20 323/282 |
| 2008/0158915 A1 | 7/2008 | Williams | |
| 2010/0026208 A1* | 2/2010 | Shteynberg | H02M 3/33507 315/297 |

(Continued)

FOREIGN PATENT DOCUMENTS

JP 2010022186 A 1/2010

*Primary Examiner* — Adam D Houston
(74) *Attorney, Agent, or Firm* — Lawrence J. Bassuk; Charles A. Brill; Frank D. Cimino

(57) ABSTRACT

A system includes an input voltage supply. The system also includes a switching converter coupled to the input voltage supply and configured to provide an output voltage based on a switch on-time. The system also includes a switch on-time controller for the switching converter. The switch on-time controller includes an analog-to-digital converter (ADC) and a delay line coupled to the ADC. The switch on-time controller also includes a delay line modulator coupled to the delay line and configured to determine an amount of times the delay line is used to determine the switch on-time.

20 Claims, 10 Drawing Sheets

(56) References Cited

U.S. PATENT DOCUMENTS

| | | | | |
|---|---|---|---|---|
| 2014/0043008 A1* | 2/2014 | Babazadeh | ............... | G05F 3/02 |
| | | | | 323/304 |
| 2014/0354461 A1* | 12/2014 | Kawano | ................ | H03M 1/502 |
| | | | | 341/155 |
| 2016/0126840 A1* | 5/2016 | Kelly | .................... | H02M 3/135 |
| | | | | 323/271 |
| 2016/0126908 A1* | 5/2016 | King | ..................... | H03F 1/0277 |
| | | | | 330/251 |
| 2018/0198461 A1* | 7/2018 | Kris | ........................ | H03M 1/18 |
| 2020/0112241 A1* | 4/2020 | Wang | ................ | H02M 3/33569 |
| 2020/0153449 A1* | 5/2020 | Snoeij | ................... | H03M 1/124 |

* cited by examiner

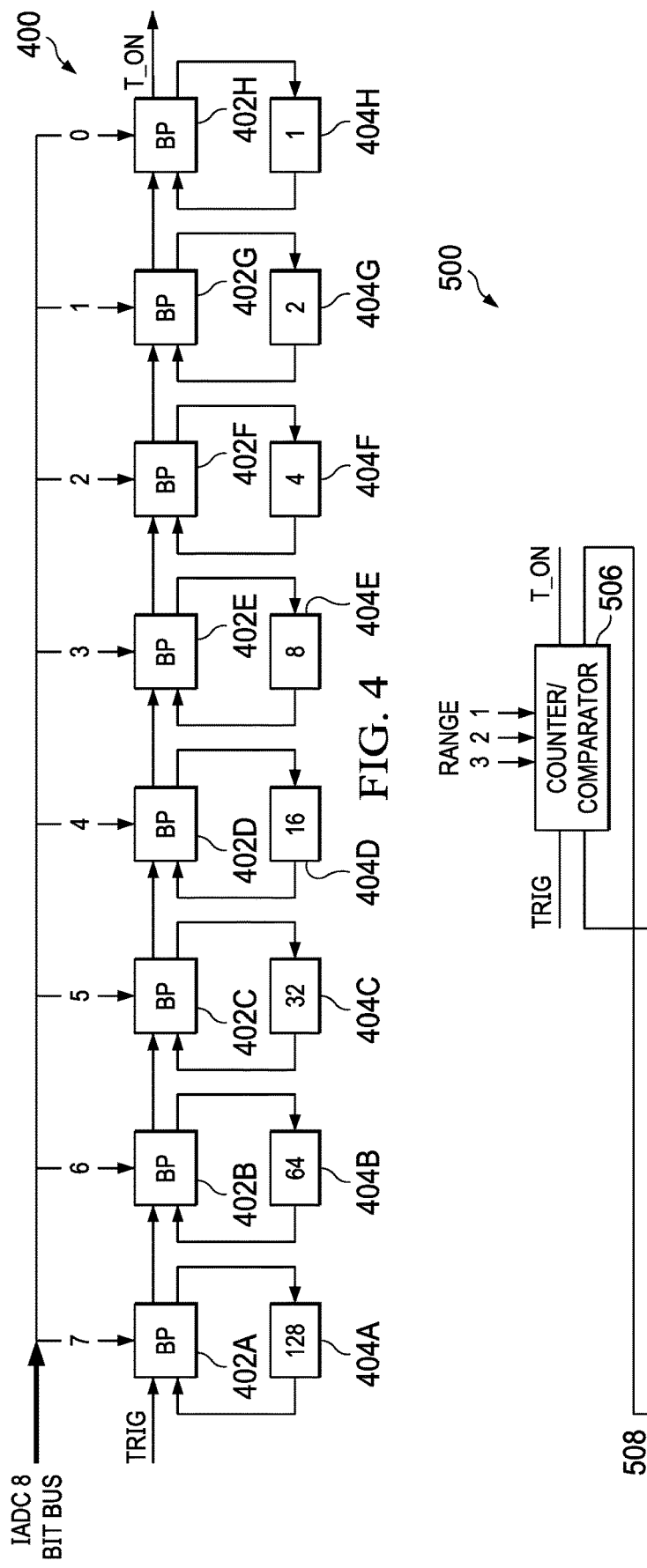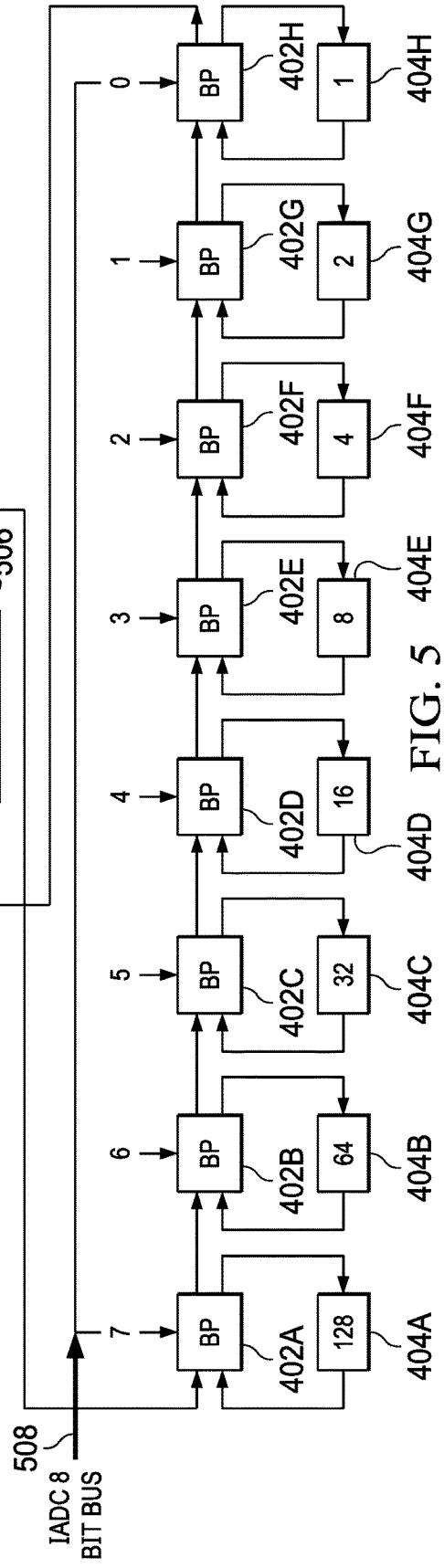

SWITCH ON-TIME CONTROLLER WITH DELAY LINE MODULATOR

CROSS-REFERENCE TO RELATED APPLICATIONS

The present application claims priority to U.S. Provisional Patent Application No. 62/791,921, filed Jan. 14, 2019.

BACKGROUND

There are many different DC-DC converter topologies. The available topologies differ with regard to the components used, the amount of power handled, the input voltage (s), the output voltage(s), efficiency, reliability, size and/or other characteristics. One DC-DC converter topology uses a digital pulse width modulation (PWM) control scheme with an analog-to-digital converter (ADC) encoder and a delay line to select a switch on-time. The digital PWM control scheme is helpful for high frequency operations where a small pulse width (e.g., ≡1 ns minimum pulse width) is used. However, the maximum pulse width, and therefore the minimum operating frequency of a DC-DC converter is limited by the number of delay cells. While increasing the number of delay cells is technically possible, such increases in the number of delay cells also increases ADC resolution, the ADC conversion time, and total area needed for the DC-DC converter. Also, the dynamic range of other components (e.g., a multiplier circuit used to calculate the on-time current) limits the ability to program a large number of delay cells. Efforts to improve converter topologies are ongoing.

SUMMARY

A system comprises an input voltage supply. The system also comprises a switching converter coupled to the input voltage supply and configured to provide an output voltage based on a switch on-time. The switching converter comprises a switch on-time controller. The switch on-time controller comprises an analog-to-digital converter (ADC) and a delay line coupled to the ADC. The switch on-time controller also comprises a delay line modulator coupled to the delay line and configured to determine an amount of times the delay line is used to determine a switch on-time.

An integrated circuit comprises an input voltage supply node. The integrated circuit also comprises a switching converter circuit coupled to the input voltage supply node. The switching converter circuit comprises a switch driver and a switch on-time controller coupled to the switch driver. The switch on-time controller comprises an ADC, a delay line coupled to the ADC, and a delay line modulator circuit coupled to the delay line.

A switching converter circuit comprises an input voltage supply node a voltage regulator circuit coupled to the input voltage supply node. The switching converter circuit also comprises a switch driver coupled to an output of the voltage regulator circuit. The switching converter circuit also comprises a switch on-time controller coupled to the switch driver. The switch on-time controller comprises ADC, a delay line coupled to the ADC, and a delay line modulator circuit coupled to the delay line.

BRIEF DESCRIPTION OF THE DRAWINGS

For a detailed description of various examples, reference will now be made to the accompanying drawings in which:

FIG. 4 is a block diagram showing a binary weighted cell count circuit for a switch on-time controller in accordance with various examples;

FIG. 5 is a block diagram showing another binary weighted cell count circuit for a switch on-time controller in accordance with various examples;

DETAILED DESCRIPTION

Disclosed herein are switch on-time controller options involving a delay-line modulator (sometimes called a delay-line re-use modulator herein). The switch on-time controller may be part of a switching converter or other device with switches. In some examples, the switch on-time controller includes an analog-to-digital converter (ADC), a delay line, and the delay-line modulator. In operation, the delay-line modulator determines the amount of times each delay cell of the delay line will be used to generate a switch on-time. In a switching converter scenario, the delay-line modulator is used to determine a new switch on-time for each switching cycle of a switching converter. With the delay-line modulator, the on-time (amount of delay) supported by the switch on-time controller relative to the number of delay cells available in the delay line is extended compared to switch on-time controllers without a delay-line modulator. To provide a better understanding, various switching converter options and related power-save mode options are described using the figures as follows.

Figure 1:
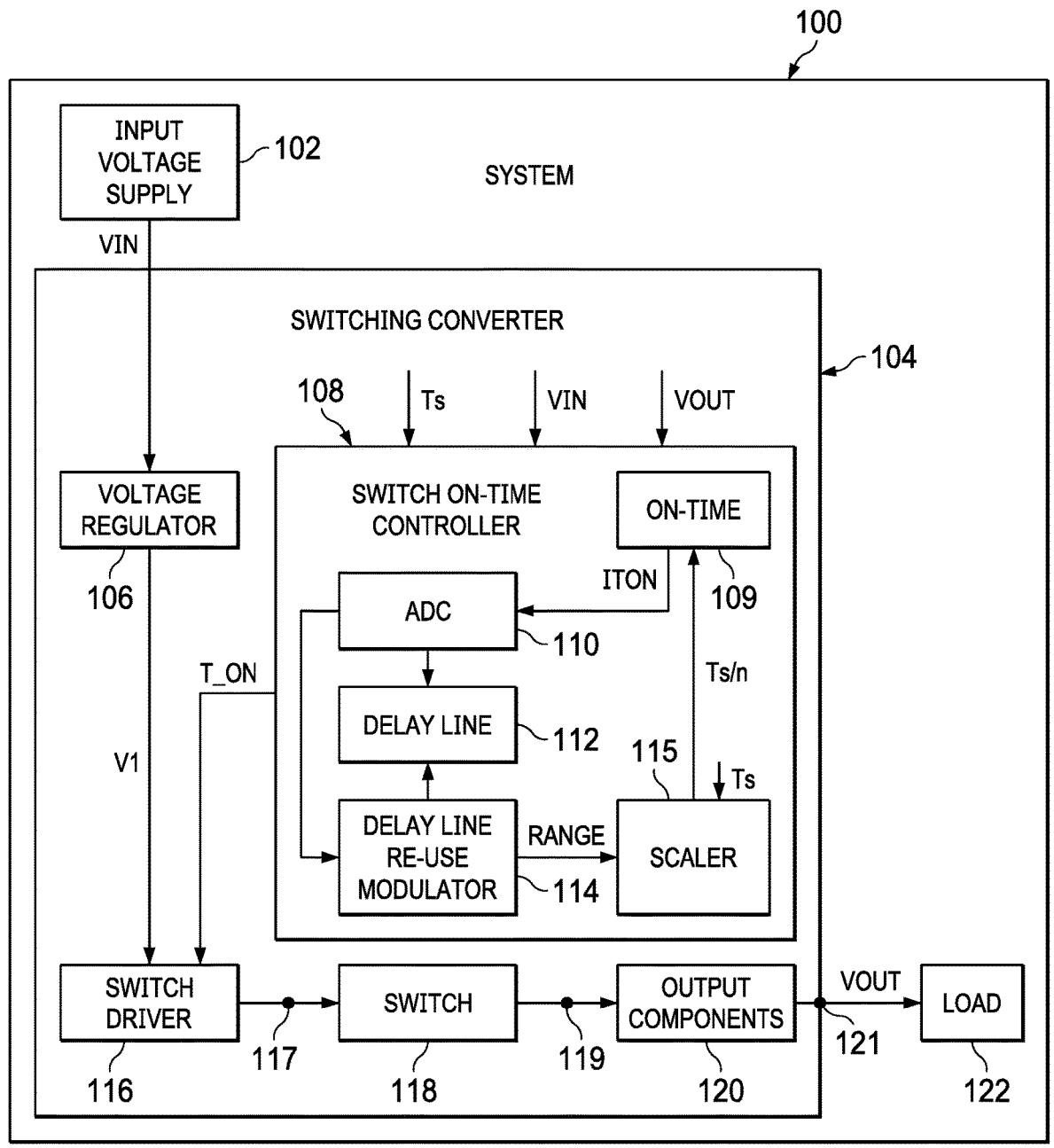
FIG. 1 is a block diagram showing a system in accordance with various examples.

FIG. 1 is a block diagram showing a system 100 in accordance with various examples. As shown, the system 100 includes a switching converter 104 that receives an input voltage (VIN) from an input voltage supply circuit 102. In the example of FIG. 1, the switching converter 104 includes a voltage regulator 106 coupled between the input voltage supply 102 and the switch driver 116. In operation, the voltage regulator 106 uses VIN to generate another voltage (V1), where V1 is used by the switch driver 116 to drive a switch 118 via a drive signal node 117 based on an on-time (T_ON) signal provided by the switch on-time controller 108. In some examples, the switch 118 corresponds to the high-side switch of a buck converter. In such examples, the output signal from the switch 118 is provided to output components 120 via a switch node 119. Example output components 120 include an output inductor and an output capacitor. As represented in FIG. 1, the output components 120 are coupled to a load 122 via an output node 121 and provide an output voltage (VOUT) to the load 122.

In some examples, the system 100 corresponds to a battery-operated device (e.g., a vehicle, a tablet computer, a smart phone). In such examples, VIN is provided by a battery or an AC/DC adapter. Also, the load 122 corresponds to electronics of the battery-operated device. Example loads include processing components, display components, sensor units, and/or other loads.

In some examples, the output node 121 corresponds to the pin of an integrated circuit (IC) that includes the switching converter 104, but not the load 122. In other examples, the switch node 119 corresponds to the pin of an IC that includes at least the switch on-time controller 108, the switch driver 116, and the switch 118, but not the output components 120. In other examples, the drive signal node 117 corresponds to the pin of an IC that includes at least the switch on-time controller 108 and the switch driver 116, but not the switch 118 or the output components 120. In other examples, the switch on-time controller 108 corresponds to a stand-alone IC that is coupled to other components of the switching converter 104 as represented in FIG. 1.

In the example of FIG. 1, the switch on-time controller 108 includes an on-time circuit 109, an ADC 110, a delay line 112, and a delay line re-use modulator 114. In some examples, the on-time circuit 109 determines an on-time based on VIN, VOUT, and a switching frequency setting (Ts). In one example, the on-time circuit 109 generates a current (ITON) to represent the determined on-time. In this example, the ADC 110 converts ITON to a multi-bit word that is used by the delay line re-use modulator 114 to determine how to use the delay line 112 to generate a signal (T_ON) corresponding to the on-time determined by the on-time circuit 109. As an example, if the delay line 112 has 256 delay cells and the on-time circuit 109 determines an on-time that corresponds to 400 delay cells, the delay line re-use modulator 114 may generate the desired T_ON signal by using 200 of 256 delay cells once, and then reusing the same 200 of 256 delay cells again (e.g., the same number of cells are re-used each time). Also, the switching frequency setting, Ts, used by the on-time circuit 109 is scaled by the amount of re-use determined for the delay line 112 (e.g., Ts is divided by 2 if the delay line 112 is used twice, Ts is divided by 3 if the delay line 112 is used three times, and so on). In the example of FIG. 1, a scaler 115 scales Ts (e.g., Ts/n) based on a RANGE value from the delay line re-use modulator 114, where the RANGE value and n corresponds to an amount of re-use determined by the delay line re-use modulator 114 for the delay line 112. In different examples, the number of delay cells available with the delay line 112 varies. Also, the number of bits output by the ADC 110 may vary. Also, the amount of delay line re-use supported by the delay line re-use modulator 114 may vary.

Figure 2:
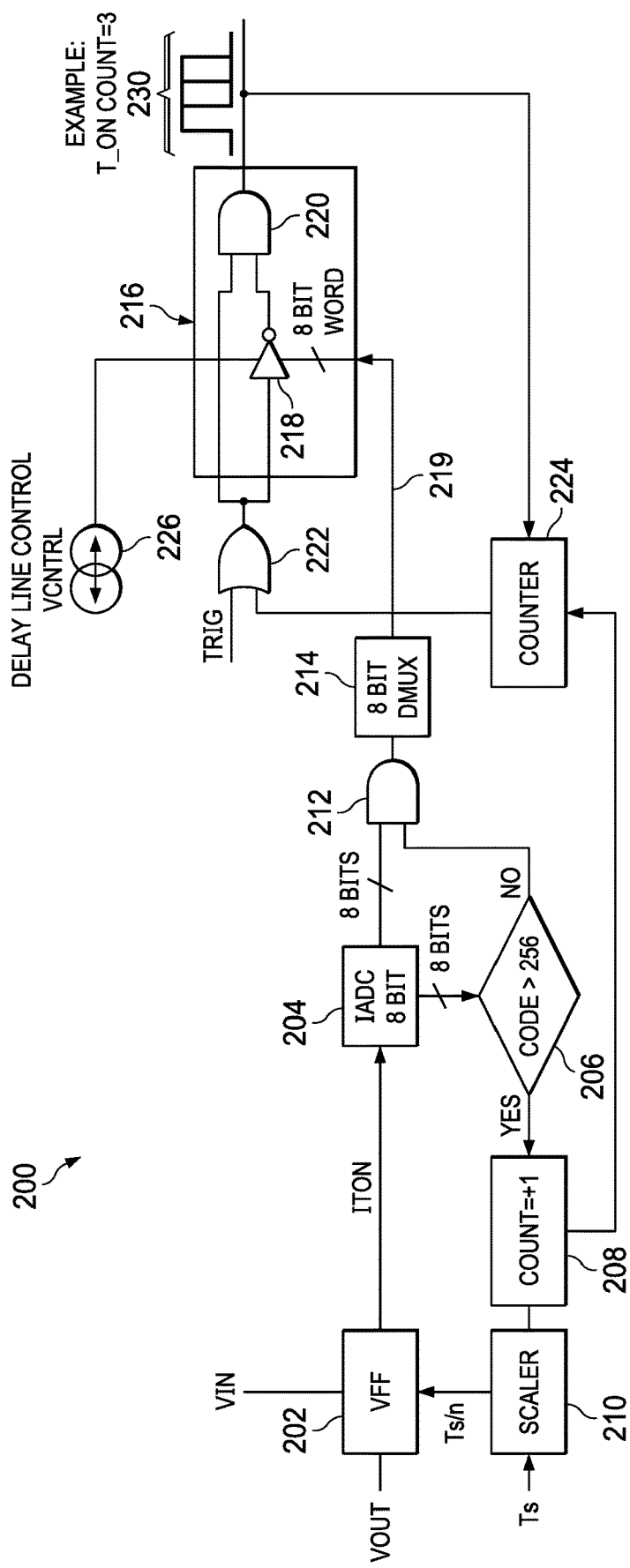
FIG. 2 is a block diagram showing a switch on-time controller in accordance with various examples.

FIG. 2 is a block diagram showing a switch on-time controller 200 (an example of the switch on-time controller 108 of FIG. 1) in accordance with various examples. As shown, the switch on-time controller 200 includes a feed-forward circuit 202 (an example of the on-time circuit 109 of FIG. 1) that provides an on-time current (ITON) based on VIN, VOUT, and Ts/N, where N is the number of times a delay line is re-used. In the example of FIG. 2, the value for Ts/N is determined by monitoring the multi-bit word (e.g., an 8-bit word in FIG. 2) output from a current ADC 204 (IADC), which receives ITON as an input signal. If the multi-bit word output from the IADC 204 has a value greater than 256 (determination block 206, where 256 is the number of delay cells in the delay line for the example of FIG. 2), the counters 208 and 224 increase their respective counts. The count value for the counter 208 is used by the scaler 210 as the value of N. Meanwhile, the count value for the counter 224 is used to determine when the delay cell 216 and all other delay cells (not shown) are re-used. If the multi-bit word output from the IADC 204 has a value equal to or less than 256 (determination block 206), an AND gate 212 allows the multi-bit word to be passed to a demultiplexer 214 (e.g., an 8-bit demultiplexer in FIG. 2). The output of the demultiplexer 214 selects which delay cells (e.g., the delay cell 216) of a delay line (not shown) are used based on the multi-bit word (e.g., 0 up to 256 delay cells are selectable).

In the example of FIG. 2, the delay cell 216 includes an inverter 218 and an AND gate 220. As shown, the inverter 218 is coupled to a voltage source 226 configured to provide a delay line control signal (VCTRL) to the inverter 218. VCTRL allows adjustments to the delay time of the individual delay cells. In this manner, precise control of the delay time is possible without suffering digital quantization effects (the digital setting provides a "course" setting, and VCTRL provides a "fine" adjustment). The inverter 218 also receives a signal 219 from the demultiplexer 214, where a high value (a logical "1") for the signal 219 enables the inverter 218, and where a low value (a logical "0") for the signal 219 disables the inverter 218. In the example of FIG. 2, the input signal to the inverter 219 comes from an OR gate 222, where a first input node of the OR gate 222 receives a trigger signal (TRIG) and a second input node of the OR gate 222 receives a signal from the counter 224. When the output from the OR gate 222 and the output from the inverter 218 are high, the AND gate 220 provides a T_ON contribution 230 determined by the count value tracked by the counter 224. In the example of FIG. 2, TRIG is a clock signal which initiates the triggering of the delay cells (e.g., the TRIG initiates triggering of the first delay cell of a delay line, which in turn triggers the next delay cell, and so on for the number of delay cells corresponding to the desired on-time). In some examples, the period of the clock signal for TRIG corresponds to I_Ts (e.g., the input to the multiplier 302 of FIG. 3) before I_Ts is scaled as described herein.

Figure 3:
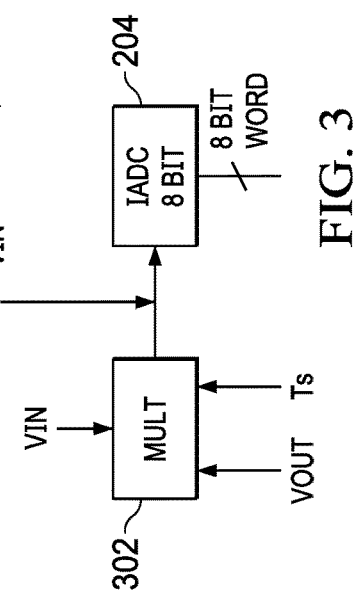
FIG. 3 is a block diagram showing components of a switch on-time controller in accordance with various examples.

FIG. 3 is a block diagram showing components of a switch on-time controller 300 without the delay cells shown (the switch on-time controller 300 represents a portion of the switch on-time controller 108, or the switch on-time controller 200 in FIG. 2) in accordance with various examples. As shown, the switch on-time controller 300 includes a multiplier 302 (an example of the feed-forward circuit 202 in FIG. 2) coupled to the IADC 204. In some examples, the multiplier 302 receives VIN, VOUT, and Ts as inputs, and provides ITON as an output. In the example of FIG. 3, ITON=K*Ts*VOUT/VIN, where K is a value applied by the multiplier 302. In some examples, K=K_adc/(T_cell*(RANGE+1)), where K_adc is a scaling constant determined by the number of bits and the maximum current to the ADC (e.g., 128 µA/8 bits=0.5 µA/bit), T_cell is the delay period for each delay cell, and RANGE corresponds to an amount of delay line re-use.

Also, ITON is provided to the IADC 204, which generates an 8-bit word from ITON in FIG. 3. In other examples, an IADC that generates a different size word from ITON is possible. Regardless of the number of bits output by the IADC 204, the input to the IADC 204 or the output from the IADC 204 may be used for delay line modulation operations as described herein.

FIG. 4 is a block diagram showing a binary weighted cell count circuit 400 for a switch on-time controller (e.g., the switch on-time controller 108 in FIG. 1, the switch on-time controller 200 in FIG. 2, and the switch on-time controller 300 in FIG. 3) in accordance with various examples. As shown, the binary weighted cell count circuit 400 includes a delay line represented as a plurality of bypass (BP) blocks 402A-402H and respective delay banks 404A-404H. With the bypass blocks 402A-402H, if a cell is not selected, the triggering signal "passes through" the binary weighted section unaffected.

In the example of FIG. 4, the delay bank 404A has 128 delay cells, the delay bank 404B has 64 delay cells, the delay bank 404C has 32 delay cells, the delay bank 404D has 16 delay cells, the delay bank 404E has 8 delay cells, the delay bank 404F has 4 delay cells, the delay bank 404G has 2 delay cells, and the delay bank 404H has 1 delay cell. Also, each of the BP blocks 402A-402H and respective delay banks 404A-404H is selectable using the values of a multi-bit word. For example, in an 8-bit word (e.g., with bits 7, 6, 5, 4, 3, 2, 1, 0, where bits 7 has the highest value), bit 7 is used to select BP block 402A or the delay circuit 404A, bit 6 is used to select BP block 402B or the delay circuit 404B, bit 5 is used to select BP block 402C or the delay circuit 404C, bit 4 is used to select BP block 402D or the delay circuit 404D, bit 3 is used to select BP block 402E or the delay circuit 404E, bit 2 is used to select BP block 402F or the delay circuit 404F, bit 1 is used to select BP block 402G or the delay circuit 404G, and bit 0 is used to select BP block 402H or the delay circuit 404H. In this manner, different amounts of delay cells are selectable or bypassed based on a multi-bit word. Also, in the example of FIG. 4, the BP blocks 402A-402H are selectively enabled using a bus to carry the TRIG signal introduced in FIG. 2.

For example, with the BP blocks 402A-402H, if a respective delay bank is not selected, the triggering signal "passes through" or bypasses a binary weighted section unaffected. For example, referring to FIG. 4, assume a delay corresponding to 160 delay cells is desired. For this amount of delay, the delay banks corresponding to BP blocks 402A and 402C are selected to provide the delay. As an example, TRIG is initially received at the BP block 402A and is then passed to the BP block 402B after a delay corresponding to the 128 delay cells of the delay bank 404A. The BP block 402B passes TRIG unaffected through to the BP block 402C. The BP block 402C then passes TRIG to the BP block 402D after a delay corresponding to the 32 cells of the delay block 404C. In this example, the BP blocks 402D-402H forward the TRIG signal unaffected to the end of the delay line corresponding to the binary weighted cell count circuit 400, where the total delay for passing TRIG through the delay line determines a switch on-time.

FIG. 5 is a block diagram showing another binary weighted cell count circuit 500 for a switch on-time controller (e.g., the switch on-time controller 108 in FIG. 1, the switch on-time controller 200 in FIG. 2, and the switch on-time controller 300 in FIG. 3) in accordance with various examples. As shown, the binary weighted cell count circuit 500 includes the plurality of BP blocks 402A-402H with respective delay circuits 404A-404H. As previously discussed with regard to FIG. 4, each of the BP blocks 402A-402H and respective delay circuits 404A-404H is selectable using the values of a multi-bit word. Also represented in FIG. 5 is a bus 508 (e.g., an IADC 8-bit bus) to provide the multi-bit word to the BP blocks 402A-402H.

In the example of FIG. 5 counter/comparator block 506 is coupled to the BP block 402A and the BP block 402H. The counter/comparator block 506 enables re-use of the BP blocks 402A-402H with respective delay circuits 404A-404H. In some examples, the amount of re-use of the selected blocks (402A-402H/404A-404H) is determined by a control signal (RANGE) input to the counter/comparator block 506. In the example of FIG. 5, RANGE is a 3-bit signal, which can signal up to 8 re-uses of the selected blocks (402A-402H/404A-404H). In other examples, RANGE has more or less bits to signal re-uses of the BP blocks 402A-402H with the respective delay circuits 404A-404H. With the BP block 506 and with RANGE, the effective delay cell count is extended. For example, with a 3-bit RANGE signal (up to 8 different values), a base delay cell count of N=256 can be extended to provide a delay corresponding to a delay cell count of N=2048 (8×256). The combination of the delay from one or more re-uses of the selected blocks (402A-402H/404A-404H) is used to output T_ON by the counter/comparator block 506, where each of the BP blocks 402A-402H is able to send a trigger signal through a respective delay circuit 404A-404H or bypass the respective delay circuit 404A-404H.

In some examples, the value for RANGE and related delay line usage is determined by monitoring the input of IADC (e.g., monitoring ITON) using an analog control circuit. In other examples, the value for RANGE and related delay line usage is determined by monitoring the output of IADC (e.g., monitoring an 8-bit word representing the delay cell count) using a digital control circuit. In all of these options, the monitoring determines if a base delay range for an available delay line (with a fixed number of delay cells) is exceeded. If so, the amount by which the base delay range is exceeded is determined. Thereafter, delay line modulation is performed to account for the amount by which the base delay range for the delay line is exceeded.

In some examples, the maximum linear range of a multiplier (e.g., the multiplier 302) is limited (e.g., 128 µA). Also, VIN and VOUT of a switching converter are bound by circuit parameters, so their inputs do not need to be scaled. The range of switching frequencies for a switching converter will determine the period (Ts). For example, for a switching converter with a 400 kHz to 4 MHz switching frequency range, Ts is 250 ns to 2.5 µs, or a 10:1 range. In some examples, Ts is provided to a multiplier (e.g., the multiplier 302) to adjust an on-time value (e.g., ITON) as the RANGE value changes.

Figure 6:
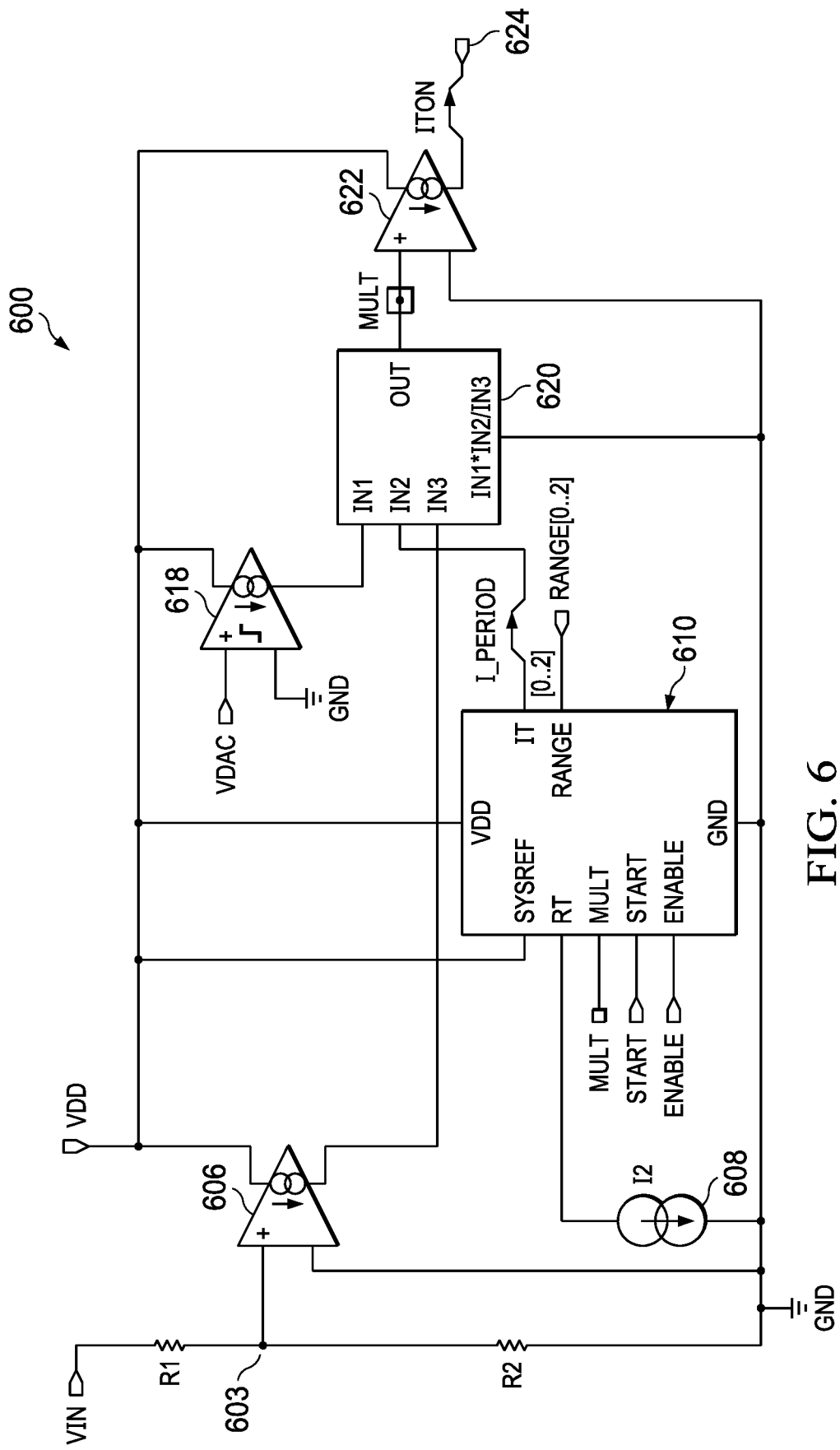
FIG. 6 is a schematic diagram showing components of a switch on-time controller in accordance with various examples.

FIG. 6 is a schematic diagram showing components of a switch on-time controller 600 (an example of the switch on-time controller 108 in FIG. 1, the switch on-time controller 200 in FIG. 2, or the switch on-time controller 300 in FIG. 3) in accordance with various examples. As shown, the switch on-time controller 600 includes an input voltage supply (VIN) node and a voltage divider formed by R1 and R2 in series between the VIN node and a ground node. In some examples, the voltage divider operates to divide VIN by 15. In the example of FIG. 6, the node 603 between R1 and R2 is coupled to a transconductance stage 606, where the transconductance stage 606 has a first input node coupled to the node 603 and a second input node coupled to ground. The transconductance stage 606 also includes another input node coupled to an input power supply (VDD) node 604. The output of the transconductance stage 606 is provided as an input signal (IN3) to a multiplication circuit 620.

Also represented in FIG. 6 is a period scaling circuit 610 with various input nodes, including a VDD node, a system reference (SYSREF) node, a multiplication node (MULT), a reference node (RT), a start node (START), an enable signal (ENABLE), a ground signal (GND). In the example of FIG. 6, a current reference source 608 provides a reference current (I2) to the RT node. The period scaling circuit 610 also includes an output node (IT), which provides a current (I_PERIOD) representing Ts. As shown, I_PERIOD is provided as another input signal (IN2) to the multiplication circuit 620. The period scaling circuit 610 also outputs the RANGE signal (RANGE [0 . . . 2]). In the example of FIG. 6, the period is scaled according to (RANGE value+1), such that RANGE=0 means no scaling (e.g., divide by 1), RANGE=1 means divide by 2, and so on. The scaled period signal along with the RANGE value determine the "frequency of operation" contributing to the switch on-time calculation.

The other input signal (IN1) for the multiplication circuit 620 is a provided by a transconductance stage 618, which has a first input node coupled to a VDAC node and a second input node coupled to a ground node. In the example of FIG. 6, VDAC is a voltage that represents the output voltage. In different examples, VDAC could be the output voltage itself, or is an independent voltage equivalent to the output voltage (e.g., a voltage used to program the output voltage).

Also, the transconductance stage 618 is powered by the VDD node 604, where the IN1 value provided to the multiplication circuit 620 represents a VOUT value. In some examples, the multiplication circuit 620 calculates an on-time value using the relationship on-time=IN1*IN2/IN3. The on-time value output by the multiplication circuit 620 is converted to an ITON value by a transconductance stage 622. In the example of FIG. 6, the period scaling circuit 610 outputs the RANGE signal in addition to scaling the period current.

Figure 7A:
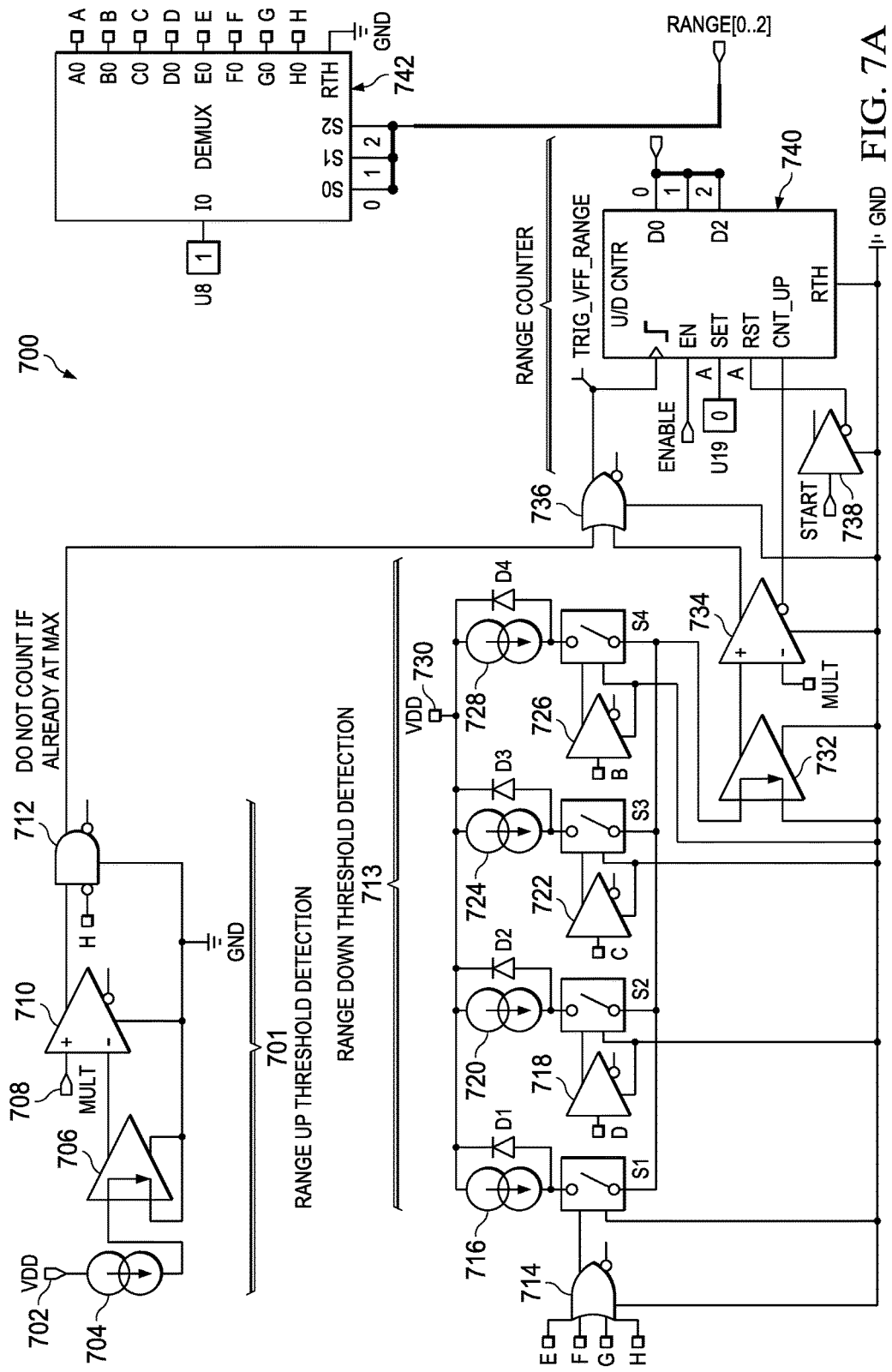
FIGS. 7A and 7B are a schematic diagram showing components of a switch on-time controller in accordance with various examples.
Figure 7B:
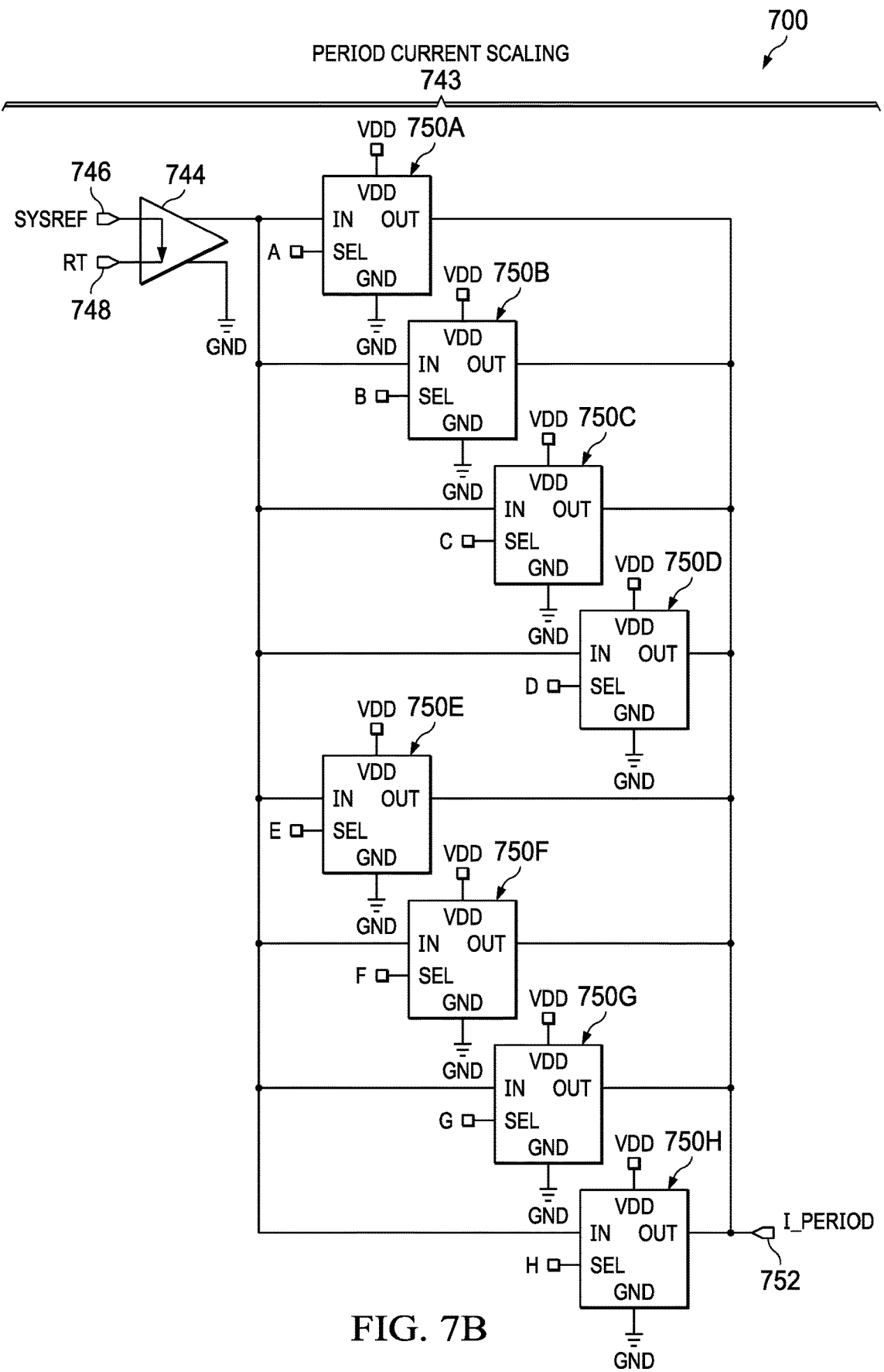

FIGS. 7A and 7B is a schematic diagram showing components of a period scaling circuit 700 (e.g., an example of the period scaling circuit 610 of FIG. 6) in accordance with various examples. As shown, the period scaling circuit 700 comprises a RANGE up threshold detection circuit 701 and a RANGE down threshold detection circuit 713 (e.g., to perform the operations of the determination block 206 in FIG. 2). The period scaling circuit 700 also comprises a RANGE counter 740 (an example of the counter 208 in FIG. 2) coupled to the RANGE up threshold detection circuit 701 and the RANGE down threshold detection circuit 713. The period scaling circuit 700 also comprises a demultiplexer 742 coupled to an output of the RANGE counter 740. The period scaling circuit 700 also comprises a period current scaling circuit 743 (an example of the scaler 210 in FIG. 2) configured to provide a period current (I_PERIOD) scaled as a function of the count tracked by the RANGE counter 740.

More specifically, in the example of FIGS. 7A and 7B, the count tracked by the RANGE counter 740 is used to control which output node (A-H) of the demultiplexer 742 provides a high signal. As shown, each of the output nodes of the demultiplexer 742 are coupled to respective scaling blocks 750A-750H of the current scaling circuit 743. Also, the current scaling circuit 743 includes a current-to-voltage converter 744 configured to provide an input signal to each of the scaling blocks 750A-750H based on the control signals SYSREF and RT from respective nodes 746 and 748. In the example of FIGS. 7A and 7B, SYSREF is a fixed reference voltage, and RT is provided by an external programming resistor. For example, the value of the external programming resistor is selected such that the current flow through the external programming resistor represents the period of the PWM signal (the rate of triggering). Accordingly, the output of current-to-voltage converter 744 represents the period of operation. Since the signal representing the period could be larger than is practical, the signal output by the current-to-voltage converter 744 is divided using the scaling blocks 750A-750H. The resulting output is a) the scaled signal, and b) a RANGE variable indicating the amount of scaling.

In operation, the RANGE value tracked by the RANGE counter 740 is updated over time based on the operations of the RANGE up threshold detection circuit 701 and the RANGE down threshold detection circuit 713. More specifically, the RANGE up threshold detection circuit 701 is configured to increase a count of the RANGE counter 740 based on the operations of a current-to-voltage converter 706, a comparator 710, and an AND gate 712. As shown, the current-to-voltage converter 706 provides an output to the negative terminal of the comparator 710 based on the difference between the output of a current source 704 and a ground node. In operation, the comparator 710 compares the output of a multiplier circuit (e.g., the multiplier circuit 620 of FIG. 6) with a signal representing a maximum allowable current. If the output of the multiplier circuit goes above the threshold set by the maximum allowable current, the value for RANGE is incremented, and the output of the current-to-voltage converter 744 is divided. The result of dividing the output of the current-to-voltage converter 744 is that the multiplier circuit output is decreased, and the RANGE is maintained until another threshold is passed.

The output of the comparator 710 is provided to the AND gate 712 based on the difference between a MULT signal provided by node 708 (e.g., the MULT signal is output from a multiplication circuit, such as the multiplication circuit 620 in FIG. 6) and the output of the current-to-voltage converter 706. The output of the comparator 710 is passed to the AND gate 712, which is configured to pass the output of the comparator 710 unless the count of the RANGE counter 740 is at a maximum value.

In the example of FIGS. 7A and 7B, the RANGE down threshold detection circuit 713 is configured to reduce a count of the range counter 740 based on the operations of various components, including current sources 716, 720, 724, and 728 with respective first sides coupled to an input voltage (VDD) node 730. As shown, diodes D1-D4 are coupled across the respective current sources (e.g., D1 is coupled across the current source 716, D2 is coupled across the current source 720, D3 is coupled across the current source 724, and D4 is coupled across the current source 728, where the cathodes of D1-D4 are coupled to the VDD node 730. The anodes of D1-D4 and the second sides of the current sources 716, 720, 724, and 728 are coupled to respective switches (S1-S4). In the example of FIGS. 7A and 7B, the control signal for S1 is based on an OR gate 714 with input nodes coupled to E-H output nodes of the demultiplexer 742. Also, the control signal for S2 is based on a buffer 718 coupled to the D output node of the demultiplexer 742. Also, the control signal for S3 is based on a buffer 722 coupled to the C output node of the demultiplexer 742. Also, the control signal for S4 is based on a buffer 726 coupled to the B output node of the demultiplexer 742.

As shown, S1-S4 are coupled to the input node of current-to-voltage converter 732. The output node of the current-to-voltage converter 732 is coupled to another comparator 734, where the output of the comparator 734 is provided to an OR gate 736 and an inverse output of the comparator 734 is provided to a count up (CNT_UP) pin of the RANGE counter 740. Also, the OR gate 736 receives the output of the RANGE up threshold detection circuit 701, where the output of the OR gate 736 is coupled to a count input node of the RANGE counter 740. Also represented in FIG. 7A is a buffer/inverter 738 coupled to a reset (RST) pin of the RANGE counter 740, where the input to the buffer/ inverter 738 is a start signal (START), which initializes the RANGE counter 740 in response to a power on event.

In operation, the RANGE up threshold detection circuit 701 is configured to use a fixed minimum for the RANGE up count. Also, the RANGE down threshold detection circuit 713 is configured to use multiple thresholds that are dependent on the RANGE setting. More specifically, B, C, and D in the RANGE down threshold detection circuit represent RANGE count adjustments from 1>0, 2>1, and 3>2. From higher range counts, the thresholds are numerically very close, so the same threshold is used (e.g., 7>6, 6>5, 5>4, and 4>3 all use the same threshold). The currents sources 716, 720, 724 and 728 represent the four thresholds that are used in the example of FIGS. 7A and 7B. Depending on the RANGE value, any one of the switches, S1-S4, is closed. In response, the current-to-voltage converter 732 converts a current received to a voltage compatible with the comparator 734, which compares the MULT signal from a multiplier (e.g., the multiplier circuit 620 of FIG. 6) to the output of the current-to-voltage converter 732. If the MULT value is less than the threshold provided by the current-to-voltage converter 732, the RANGE is decreased and period scaling performed by the period scaling circuit 743 is adjusted accordingly. In some examples, the diodes D1, D2, D3, and D4 are omitted.

In the period scaling circuit 700 of FIGS. 7A and 7B, analog components are used to provide switch on-time control involving delay-line modulation. In other examples, a digital control circuit is used to provide switch on-time control involving delay-line modulation. In an example digital control circuit implementation of a period scaling circuit, the RANGE up threshold detection circuit 701 is replaced by a digital comparison of the IADC output compared to a digital value (e.g., 256). Also, the RANGE down threshold detection circuit 713 is replaced with a digital equivalent that selects and compares the IADC output to digital words (e.g., four digital words) representing the RANGE-down thresholds.

Figure 8:
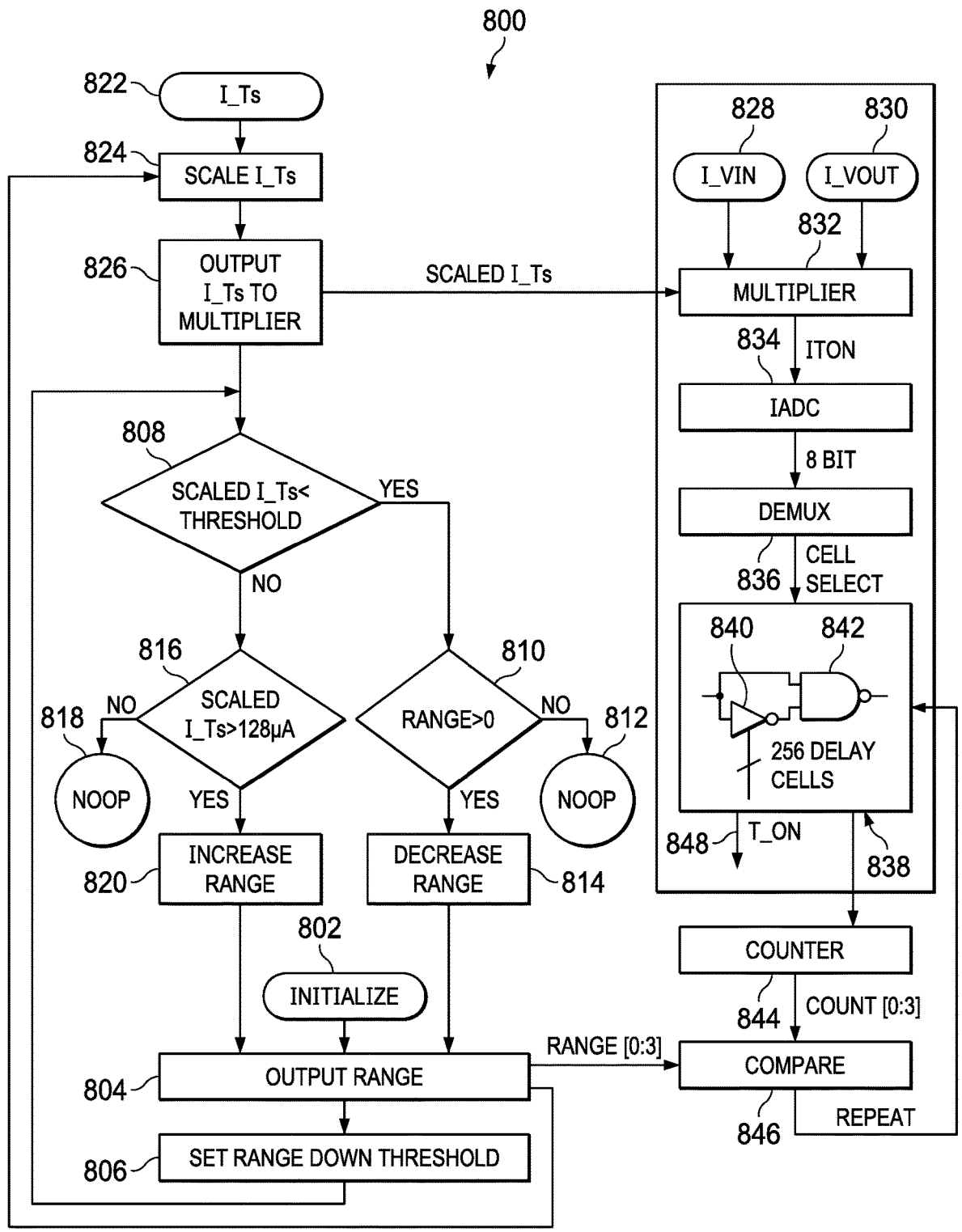
FIG. 8 is a block diagram showing operations and components of a switch on-time controller in accordance with various examples.

FIG. 8 is a block diagram showing operations and components of a switch on-time controller 800 (e.g., the switch on-time controller 108 of FIG. 1) in accordance with various examples. With the switch on-time controller 800, analog monitoring and adjustment operations are performed to control the RANGE value (i.e., to perform delay line modulation). As shown, the switch on-time controller 800 is initialized at block 802. At block 804, an output RANGE value is determined. At block 806, a RANGE down threshold is determined. At determination block 808, a current that represents the switching period, I_Ts, is compared with the RANGE down threshold. In the example of FIG. 8, an initial value of I_Ts is provided at block 822, where the initial value for I_Ts is scaled at block 824 based on the output RANGE value determined at block 804. Thus, it is the scaled I_Ts value that is used by the determination block 808. If the scaled I_Ts value is less than the RANGE down threshold (determination block 808), a determination is made regarding whether the RANGE value is greater than 0 (determination block 810). If the RANGE value is greater than 0 (determination block 810), the RANGE value is decreased at block 814. Otherwise, if the RANGE value is not greater than 0, the switch on-time controller 800 transitions to a NOOP (no operation) state 812 (the RANGE value stays the same as before).

Returning to determination block 808, if the scaled I_Ts value is not less than the RANGE down threshold (determination block 808), a determination is made regarding whether the RANGE value is greater than 128 µA (determination block 816). If the scaled I_Ts value is not greater than 128 µA (determination block 816), the switch on-time controller 800 transitions to a NOOP operation 818. On the other hand, if the scaled I_Ts value is greater than 128 µA (determination block 816), the switch on-time controller 800 increases the RANGE value at block 820. Over time, the increased RANGE value from block 820 or the decreased RANGE value from block 814 is provided to block 804 to adjust the output RANGE value.

In the example of FIG. 8, the RANGE value (e.g., a 3-bit value RANGE 0:3) determined by block 804 is used by a compare block 844, which compares the RANGE value with a count value (e.g., a 3-bit value COUNT 0:3) provided by a counter 846 (an example of the counter 208 in FIG. 2, or the RANGE counter 740 in FIG. 7A). The output of the compare block 844 is used by delay cells (e.g., the delay cell 838) as a repeat signal, where all delay cells of a delay line (not shown) are re-used as needed based on the RANGE value and the COUNT value.

In the example of FIG. 8, a multiplier 832 (an example of the feed-forward circuit 202 of FIG. 2, the multiplication circuit 302 in FIG. 3, or the multiplication circuit 620 of FIG. 6) receives the scaled I_Ts from block 826, a current representing VIN (I_VIN) from block 828, and a current representing VOUT (I_VOUT) from block 830. The output of the multiplier 832 is ITON (e.g., ITON=I_Ts*I_VOUT/I_VIN). As shown, ITON is provided to an IADC 834 (an example of the IADC 204 in FIG. 2), where the output of the IADC 834 is provided to a demultiplexer 836. The output of the demultiplexer 836 is used to select delay cells needed to generate a desired on-time (T_ON), where the combination of RANGE and delay cells is used to generate T_ON. In the example of FIG. 8, the delay cell 838 includes an inverter 840 and an AND gate 842. In some examples, the delay cell is one of many delay cells (e.g., 256 delay cells), each having a respective inverter and an AND gate. As described herein, re-use of a delay line is modulated to extend a switch on-time (T_ON) without additional delay cells. Over time, the process represented in FIG. 8 is repeated (e.g., for each switching cycle of a switching converter).

Figure 9:
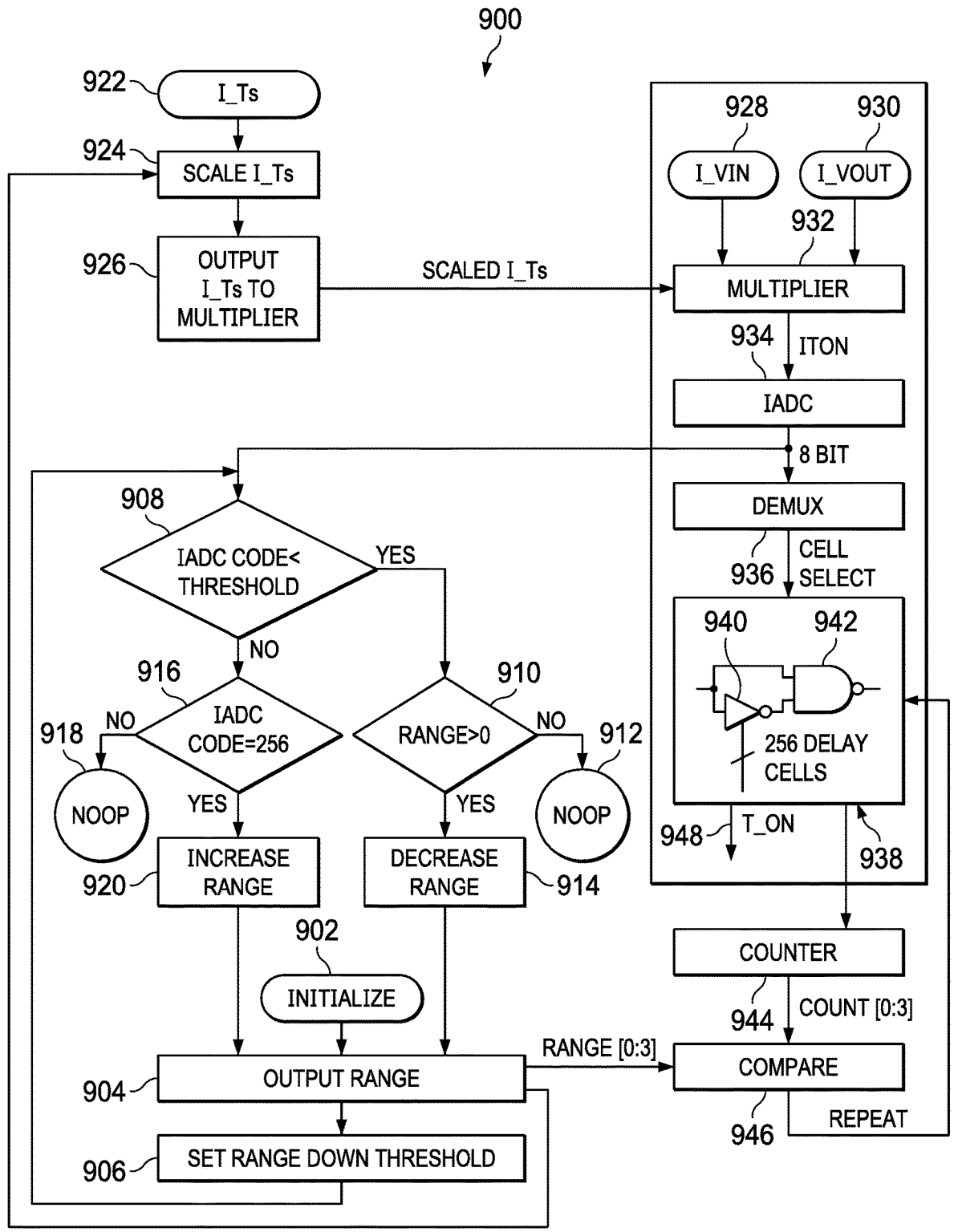
FIG. 9 is a block diagram showing operations and components of another switch on-time controller in accordance with various examples.

FIG. 9 is a block diagram showing operations and components of another switch on-time controller 900 (e.g., the switch on-time controller 108 of FIG. 1, or other switch on-time controller as described herein) in accordance with various examples. With the switch on-time controller 900, digital control circuit monitoring and adjustment operations are performed to control the RANGE value (i.e., to perform delay line modulation). As shown, the switch on-time controller 900 is initialized at block 902. At block 904, an output RANGE value is determined. At block 906, a RANGE down threshold is determined. At determination block 908, a current that represents the switching period, I_Ts, is compared with the RANGE down threshold. In the example of FIG. 9, an initial value of I_Ts is provided at block 922, where the initial value for I_Ts is scaled at block 924 based on the output RANGE value determined at block 904.

At block 924, the scaled I_Ts value is provided to a multiplier 932 (an example of the feed-forward circuit 202 of FIG. 2, the multiplication circuit 302 in FIG. 3, or the multiplication circuit 620 of FIG. 6). The multiplier 932 also receives an I_VIN value from block 928, and a I_VOUT value from block 930. The output of the multiplier 932 is ITON (e.g., ITON=I_Ts*I_VOUT/I_VIN). As shown, ITON is provided to an IADC 934 (an example of the IADC 204 in FIG. 2), where the output of the IADC 934 is provided to a demultiplexer 936 and to the determination block 908. The output of the demultiplexer 836 is used to select delay cells needed to generate a desired on-time (T_ON), where the combination of delay cells and the RANGE value is used to generate T_ON. In the example of FIG. 9, the delay cell 938 includes an inverter 940 and AND gate 942. In some examples, the delay cell is one of many delay cells (e.g., 256 delay cells), each having a respective inverter and AND gate. As described herein, re-use of a delay line is modulated to extend a switch on-time (T_ON) without additional delay cells.

To determine the amount of re-use of a delay line, the switch on-time controller 900 compares the IADC code to a threshold at the determination block 908. If the IADC code is less than a threshold, a determination is made regarding whether the RANGE value is greater than 0 (determination block 910). If the RANGE value is greater than 0 (determination block 910), the RANGE value is decreased at block 914. Otherwise, if the RANGE value is not greater than 0, the switch on-time controller 900 transitions to a NOOP (no operation) state 812 (the RANGE value stays the same as before).

Returning to determination block 908, if the IADC code is not less than a threshold, a determination is made regarding whether the IADC code is equal to a threshold (e.g., 256) at determination block 916. If the IADC code is not equal to the threshold (determination block 916), the switch on-time controller 900 transitions to a NOOP operation 918. On the other hand, if the IADC code is equal to the threshold (determination block 916), the switch on-time controller 900 increases the RANGE value at block 920. Over time, the increased RANGE value from block 920 or the decreased RANGE value from block 914 is provided to block 904 to adjust the output RANGE value.

In the example of FIG. 9, the RANGE value (e.g., a 3-bit value RANGE 0:3) determined by block 904 is used by a compare block 946, which compares the RANGE value with a count value (e.g., a 3-bit value COUNT 0:3) provided by a counter 944 (an example of the counter 208 in FIG. 2, or the RANGE counter 740 in FIG. 7A). The output of the compare block 946 is used by delay cells (e.g., the delay cell 938) as a repeat signal, where all delay cells of a delay line (not shown) are re-used as needed based on the RANGE value and the COUNT value. Over time, the process represented in FIG. 9 is repeated (e.g., for each switching cycle of a switching converter)

Figure 10A:
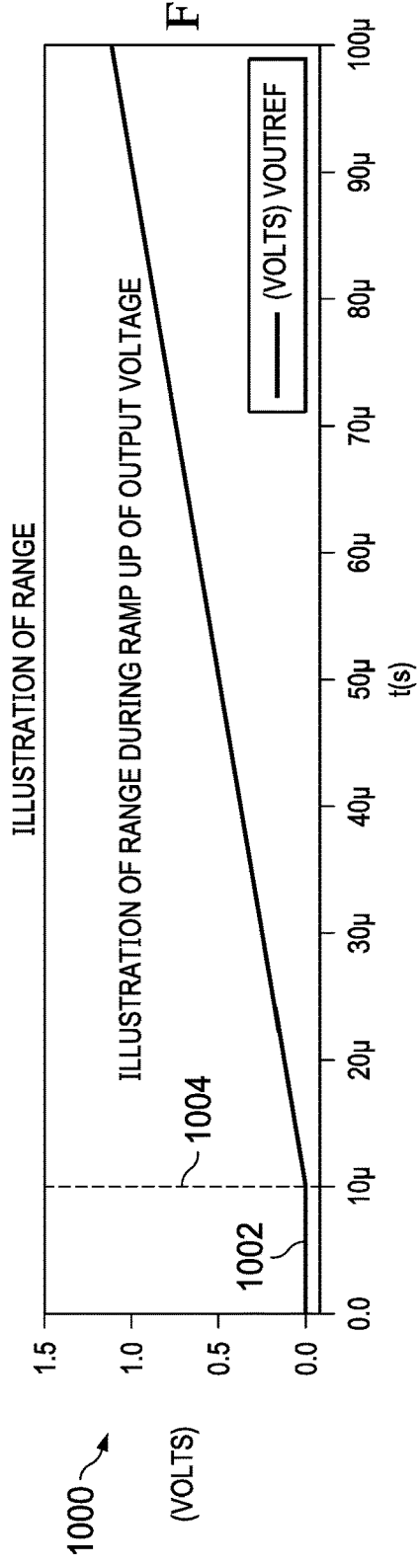
FIG. 10A-10C are timing diagrams related to a switch on-time controller in accordance with various examples.
Figure 10B:
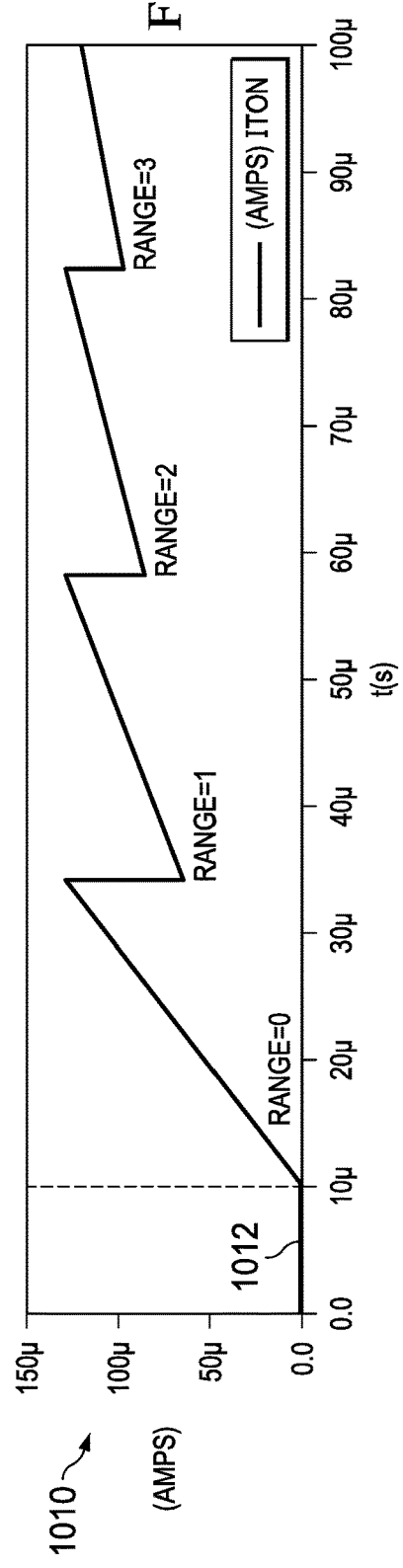
Figure 10C:
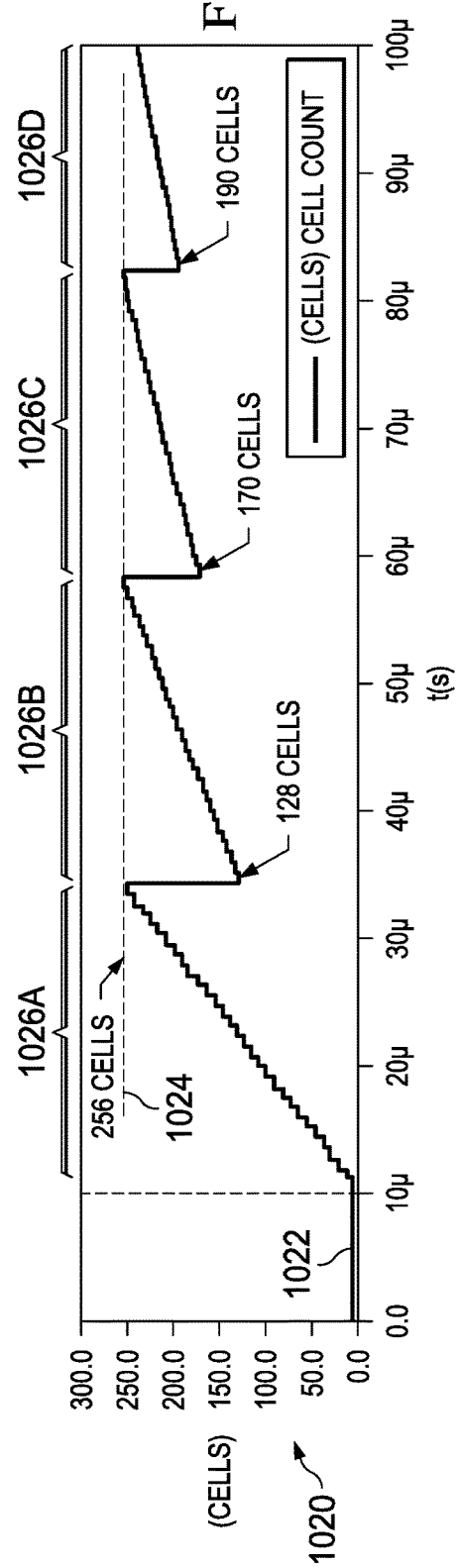

FIGS. 10A-10C are timing diagrams 1000, 1010, and 1020 showing waveforms related to a switch on-time controller (e.g., the switch on-time controller 108 of FIG. 1, or other switch on-time controller as described herein) in accordance with various examples. In the timing diagram 1000 of FIG. 10A, the waveform 1002 represents a switch converter output voltage (VOUTREF) as a function of time. As shown with the waveform 1002, VOUTREF is flat until time 1004. After time 1004, VOUTREF increases linearly over time. In the timing diagram 1010 of FIG. 10B, the waveform 1012 represents ITON (a current used to represent a switch on-time) as a function of time. As shown with the waveform 1012, ITON increases after time 1004 until a threshold 1016 (e.g., around 125 µA in FIG. 10B) is reached (e.g., ITON increases as VOUTREF increases). Whenever the threshold 1016 is reached (e.g., at times 1014A, 1014B, and 1014C), the RANGE value increases and ITON decreases to a lower value. As described herein, the RANGE value corresponds to the number of times a delay line and/or delay cells of a delay line are re-used.

In the timing diagram 1020 of FIG. 10C, the waveform 1022 represents the delay cell count (the number of delay cells used to generate a switch on-time) as a function of time. As shown with the waveform 1022, the delay cell count increases after time 1004 until a threshold 1024 (e.g., 256 delay cells in FIG. 10C) is reached (e.g., the delay cell count increases as VOUTREF and ITON increase). Whenever the threshold 1024 is reached, the number of times a delay cell is re-used increases. As illustrated in the timing diagram 1020 of FIG. 10C, different portions 1026A, 1026B, 1026C, and 1026D of the waveform 1022 correspond to different amount of delay cell re-use. More specifically, the portion 1026A corresponds to no re-use (one total use) for up to a maximum of 256 delay cells, the portion 1026B corresponds to one re-use (two total uses) for up to a maximum of 256 delay cells, the portion 1026C corresponds to two re-uses (three total uses) for up to a maximum of 256 delay cells, and the portion 1026D corresponds to three re-uses (four total uses) for up to a maximum of 256 delay cells.

For example, the timing diagram 1020 shows that the delay for 256 delay cells is the same as the delay for 128 delay cells used twice. Also, the delay for 512 (256×2=512) delay cells is approximately the same as the delay for 170 delay cells used three times (170×3=510). Also, the delay for 768 (256×3) delay cells is approximately the same as the delay for 190 delay cells used four times (190×4=760). Thus, the timing diagrams 1000, 1010, and 1020 show an example of extending a switch on-time range to account for different output voltage levels, where a limited number of delay cells (e.g., 256 delay cells) are available. With appropriate management of delay line modulation and related components, the switch on-time range is extendable as needed beyond the range of a delay line with a fixed number of delay cells.

The disclosed switch on-time controller options involving a delay-line modulator (sometimes called a delay-line re-use modulator herein) provide various distinctive features relative to other switch on-time controllers including a new algorithm for determining delay line control parameters such as cell count and RANGE. Also, the disclosed switch on-time controller options are distinctive with regard to providing computational capability with combinatorial logic. Also, the disclosed switch on-time controller options are distinctive with regard to providing auto-scaling.

In some examples, the disclosed switch on-time controller options are compatible with IADCs and/or with voltage feedforward (VFF) multipliers that have limitations that limit pulse width. In such cases, the disclosed switch on-time controller options are able to work within the IADC and/or VFF multiplier limits. In contrast to conventional range extenders which require end point knowledge before selecting cell count and range, the disclosed switch on-time controller options are distinctive in that the end point is an unknown until reached. Also, the disclosed switch on-time controller options are self-determining and thus no user intervention is required to select the proper operating condition. Also, the disclosed switch on-time controller options are unique in that they use a circuit to determine the desired on-time during operation.

Relative to other switch on-time controllers, the disclosed switch on-time controller options increase the operating range of a digital pulse width modulator (DPWM) while maintaining the advantages. Also, the impact of the disclosed switch on-time controller options has little impact on the characteristics of the DPWM (i.e. non-intrusive). Also, the disclosed switch on-time controller options allow a DPWM to operate with pulse widths beyond the cell count limitation. In different examples, the disclosed switch on-time controller options provide the ability for a PWM controller to operate at any practical frequency (10 kHz to 10

MHz) without compromised performance. Also, the disclosed switch on-time controller options support a continuous range of ON time values (no discrete value settings).

Designing a conventional RAMP based PWM to operate over a wide continuous frequency range requires complex circuits and tradeoffs in supply voltage, signal-to-noise, and minimum controllable pulse width. By including a "range extender" circuit, a DPWM's (cell-count limited) ON-time is extended without performance tradeoffs, significant die size increase, or cost penalty, allowing a single device to be used in a wider range of applications that otherwise would be practical. The auto-scaling feature reduces the burden to configure the system and allows the DPWM to be used in a broad range of applications.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A system, comprising:
   a voltage supply input; and
   a switching converter coupled to the voltage supply input and configured to provide an output voltage on a voltage output based on a switch on-time, the switching converter including a switch on-time controller, and the switch on-time controller includes:
   an analog-to-digital converter (ADC);
   a delay line coupled to the ADC; and
   a delay line modulator coupled to the delay line and configured to determine an amount of times the delay line is used to determine the switch on-time.

2. The system of claim 1, in which the delay line modulator includes an analog circuit configured to compare an input to the ADC to a threshold to determine the amount of times the delay line is used to determine a switch on-time.

3. The system of claim 1, in which the delay line modulator includes a digital control circuit configured to compare an output of the ADC to a threshold to determine the amount of times the delay line is used to determine a switch on-time.

4. The system of claim 1, in which the delay line modulator includes a counter configured to track the amount of times the delay line is used to determine a switch on-time.

5. The system of claim 1, including a scaler coupled to the delay line modulator, the scaler is configured to divide a period signal for the switching converter based on the amount of times the delay line is used to determine a switch on-time.

6. The system of claim 1, in which the ADC is an 8-bit ADC and the delay line has 256 delay cells.

7. The system of claim 1, in which the switch on-time controller is configured to determine the amount of times the delay line is used to determine a switch on-time for every switching cycle.

8. An integrated circuit, comprising:
   an input voltage supply node; and
   a switching converter circuit coupled to the input voltage supply node, the switching converter circuit including:
   a switch driver; and
   a switch on-time controller coupled to the switch driver and configured to determine a switch on-time to be used by the switch driver, the switch on-time controller including:
   an analog-to-digital converter (ADC);
   a delay line coupled to the ADC; and
   a delay line modulator circuit coupled to the delay line, the delay line and the delay line modulator circuit determine the switch on-time.

9. The integrated circuit of claim 8, in which the delay line modulator includes an analog comparator circuit configured to compare an input to the ADC to a threshold to determine an amount of times the delay line is used to determine a switch on-time.

10. The integrated circuit of claim 8, in which the delay line modulator includes a digital comparator circuit configured to compare an output of the ADC to a threshold to determine an amount of times the delay line is used to determine a switch on-time.

11. The integrated circuit of claim 8, in which the delay line modulator includes a counter configured to track an amount of times the delay line is to be used to determine a switch on-time.

12. The integrated circuit of claim 8, in which the switching converter circuit includes a scaler coupled to the delay line modulator, the scaler is configured to divide a period signal for the switching converter circuit based on the amount of times the delay line is used to determine a switch on-time.

13. The integrated circuit of claim 8, including a high-side switch coupled to the switch driver.

14. A switching converter circuit, comprising:
   an input voltage supply node;
   a voltage regulator circuit coupled to the input voltage supply node and having an output;
   a switch driver coupled to the output of the voltage regulator circuit and having an output; and
   a switch on-time controller coupled to the output of the switch driver, the switch on-time controller including:
   a delay line with delay cells; and
   a delay line modulator circuit coupled to the delay line, the delay line modulator circuit is configured to determine an adjustable number of times each of the delay cells is used to provide a switch on-time.

15. The switching converter circuit of claim 14, in which the delay line modulator includes an analog comparator circuit configured to compare an input to the ADC to a threshold to determine an amount of times the delay line is used to determine a switch on-time.

16. The switching converter circuit of claim 14, in which the delay line modulator includes a digital comparator circuit configured to compare an output of the ADC to a threshold to determine an amount of times the delay line is used to determine a switch on-time.

17. The switching converter circuit of claim 14, in which the delay line modulator includes a counter configured to track an amount of times the delay line is to be used to determine a switch on-time.

18. The switching converter circuit of claim 14, in which the switching converter circuit includes a scaler coupled to the delay line modulator, the scaler is configured to divide a period signal for the switching converter circuit based on the amount of times the delay line is used to determine a switch on-time.

19. The switching converter circuit of claim 14, including a high-side switch coupled to the switch driver, the switch on-time controller directs the switch driver to provide a drive signal to the high-side switch for a switch on-time determined by the switch on-time controller.

20. The switching converter circuit of claim 19, in which the switch on-time controller is configured to determine an amount of times the delay line is used to determine a switch on-time for every switching cycle of the high-side switch.

* * * * *